(12) United States Patent
Zhou

(10) Patent No.: US 10,446,648 B2
(45) Date of Patent: Oct. 15, 2019

(54) SEMICONDUCTOR DEVICE AND MANUFACTURING METHOD THEREOF

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Fei Zhou, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 61 days.

(21) Appl. No.: 15/365,825

(22) Filed: Nov. 30, 2016

(65) Prior Publication Data

US 2017/0154962 A1    Jun. 1, 2017

(30) Foreign Application Priority Data

Dec. 1, 2015    (CN) .......................... 2015 1 0860803

(51) Int. Cl.
*H01L 29/10* (2006.01)
*H01L 21/762* (2006.01)
(Continued)

(52) U.S. Cl.
CPC .... *H01L 29/1083* (2013.01); *H01L 21/76224* (2013.01); *H01L 29/0653* (2013.01);
(Continued)

(58) Field of Classification Search
CPC ................................................. H01L 21/76216
See application file for complete search history.

(56) References Cited

U.S. PATENT DOCUMENTS

2006/0244051 A1    11/2006    Izumida et al.
2009/0072276 A1    3/2009    Inaba
(Continued)

FOREIGN PATENT DOCUMENTS

CN    103531477    1/2014
CN    104752214    7/2015
(Continued)

OTHER PUBLICATIONS

European Application No. 16199530.3, Extended European Search Report dated Apr. 19, 2017, 9 pages.
(Continued)

*Primary Examiner* — Moazzam Hossain
*Assistant Examiner* — Hajar Kolahdouzan
(74) *Attorney, Agent, or Firm* — Kilpatrick Townsend & Stockton LLP

(57) ABSTRACT

A method for manufacturing a semiconductor device includes providing a substrate, forming an amorphous layer in the substrate, performing a first etching process on the substrate using the amorphous layer as an etch stop layer to form a plurality of first fins, performing a channel stop ion implantation process into the amorphous layer to form an impurity region, and performing an annealing process to activate implanted dopants in the impurity region, wherein the amorphous layer disappears during the annealing process. The method also includes performing a second etching process on a region of the substrate disposed between the first fins to form second fins from the first fins, and forming an isolation region between adjacent second fins by filling at least a portion of an air gap between the second fins with an (Continued)

insulating material. The method prevents dopants of the channel stop implant from diffusing into the channel.

8 Claims, 5 Drawing Sheets

(51) Int. Cl.
    *H01L 29/06*     (2006.01)
    *H01L 29/66*     (2006.01)
    *H01L 29/78*     (2006.01)

(52) U.S. Cl.
    CPC .. *H01L 29/66537* (2013.01); *H01L 29/66795* (2013.01); *H01L 29/66803* (2013.01); *H01L 29/7851* (2013.01)

(56) References Cited

U.S. PATENT DOCUMENTS

| | | |
|---|---|---|
| 2010/0248454 A1 | 9/2010 | Maszara et al. |
| 2013/0105914 A1 | 5/2013 | Lin |
| 2013/0313619 A1 | 11/2013 | Fumitake |
| 2015/0303273 A1* | 10/2015 | Bouche ................. H01L 29/785 257/365 |
| 2016/0071925 A1* | 3/2016 | Jaffe ................... H01L 29/0649 257/347 |
| 2016/0268392 A1 | 9/2016 | Zhu |
| 2016/0293734 A1* | 10/2016 | Tang ................. H01L 29/66795 |

FOREIGN PATENT DOCUMENTS

| | | |
|---|---|---|
| CN | 104916539 | 9/2015 |
| CN | 105336617 | 2/2016 |
| WO | 2015078104 | 6/2015 |

OTHER PUBLICATIONS

Takahashi et al., FinFETs with both large body factor and high drive-current, Semiconductor Device Research Symposium, Dec. 12-14, 2007, 2 pages.

Chinese Patent Application No. 201510860803.9, Office Action dated Mar. 25, 2019, 6 pages.

* cited by examiner

SEMICONDUCTOR DEVICE AND MANUFACTURING METHOD THEREOF

CROSS-REFERENCES TO RELATED APPLICATIONS

The present application claims priority to Chinese patent application No. 201510860803.9, filed with the State Intellectual Property Office of People's Republic of China on Dec. 1, 2015, the content of which is incorporated herein by reference in its entirety.

FIELD OF THE INVENTION

The present invention relates to integrated semiconductor devices, and more particularly to a fin-type field effect transistor (FinFET) device and method for manufacturing the same.

BACKGROUND OF THE INVENTION

As the critical dimension of metal oxide semiconductor field effect transistor (MOSFET) devices continues to shrink, the short channel effect becomes more problematic. Fin field effect transistor (FinFET) devices have good control capability of gates to effectively suppress the short channel effect. FinFET devices can also reduce random dopant fluctuation to improve the stability of the devices. Thus, FinFET devices are widely used in the design of small-sized semiconductor elements.

A reduced feature size of a semiconductor device leads to problems of punch through effect. In order to prevent punch through a channel stop implant is placed at the bottom portion of the fin. However, for an NMOS device, dopants of the channel stop implant are typically boron or difluoride ions; after annealing for activation of the implanted dopants, due to random dopant fluctuation, the implanted dopants of the channel stop implant will easily diffuse into the channel, thereby greatly degrading the performance of the device, such as lowering the carrier mobility.

In order to suppress the diffusion of dopants into the channel, an amorphous layer is generally formed in the fin. However, the present inventor discovered that the current process includes firstly forming a shallow trench isolation (STI), then performing a channel stop implant, so that the amorphous layer will disappear after a high-temperature annealing process. Thus, the implanted dopants will diffuse into the channel after the channel stop ion implantation.

Therefore, there is a need for an improved fin-type FET device and method for manufacturing the same to overcome the above drawbacks

BRIEF SUMMARY OF THE INVENTION

Embodiments of the present invention provide a novel method for manufacturing a semiconductor device, which can suppress or prevent dopants of a channel stop ion implantation from diffusing into the channel. The method includes providing a substrate, forming an amorphous layer in the substrate, performing a first etching process on the substrate using the amorphous layer as an etch stop layer to form a plurality of first fins, performing a channel stop ion implantation process into the amorphous layer to form an impurity region, and performing an annealing process to activate dopants in the impurity region, wherein the amorphous layer disappears during the annealing process. The method also includes performing a second etching process on a region of the substrate disposed between the first fins to form a plurality of second fins from the first fins, and forming an isolation region between adjacent second fins by filling an air gap between the second fins with an insulating material.

In one embodiment, forming the amorphous layer may include implanting germanium ions or carbon ions in the substrate.

In one embodiment, performing the first etching process includes forming a patterned hardmask on the substrate, and performing the first etching process on the substrate using the patterned hardmask as a mask to form the first fins.

In one embodiment, forming the isolation region includes depositing the insulating material in the air gap between the second fins and covering the second fins and the hardmask, planarizing the insulating material until an upper surface of the insulating material is flush with an upper surface of the hardmask, performing an etching back process on the planarized insulating material to expose at least a portion of the second fins, and removing the hardmask.

In one embodiment, depositing the insulating material includes performing a flowable chemical vapor deposition process.

In one embodiment, forming the amorphous layer includes performing an ion implantation process with boron ions or boron difluoride ions on the substrate.

In one embodiment, the method also includes forming a well region in the substrate. The well region and the impurity region have a same conductivity type, and a doping concentration of the well region is less than a doping concentration of the impurity region.

Embodiments of the present invention also provide a semiconductor device including a substrate, a plurality of fins on the substrate, each of the fins comprising a semiconductor material region and an impurity region disposed in the semiconductor material region, and an isolation region between the fins.

In one embodiment, an upper surface of the impurity region is below an upper surface of the isolation region.

In one embodiment, the impurity region forms a channel stop layer.

In one embodiment, the semiconductor device also includes a well region in the substrate, wherein the well region and the impurity region have a same conductivity type, and a doping concentration of the well region is less than a doping concentration of the impurity region.

The following detailed description together with the accompanying drawings will provide a better understanding of the nature and advantages of the present invention.

DETAILED DESCRIPTION OF THE INVENTION

Figure 1:
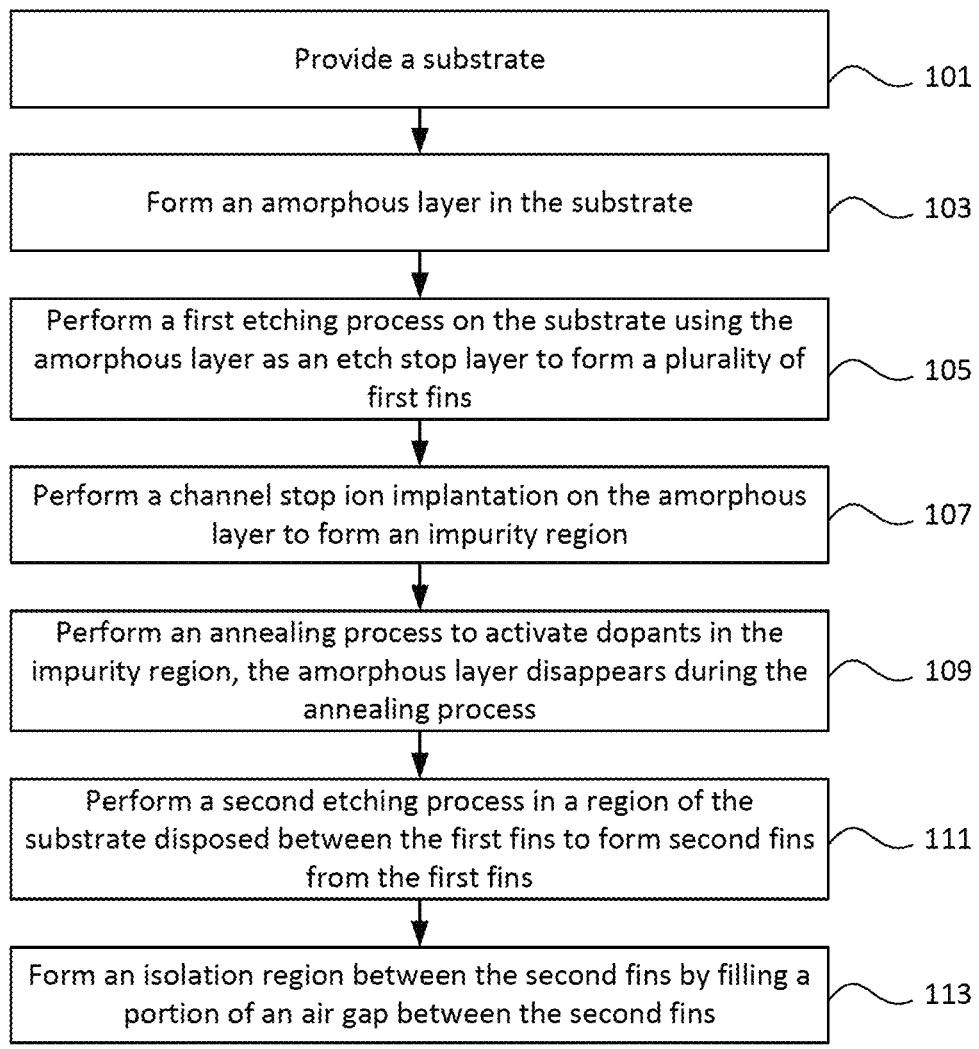
FIG. 1 is a simplified flowchart of a method for manufacturing a semiconductor device according to an embodiment of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein.

FIG. 1 is a simplified flowchart of a method for manufacturing a semiconductor device according to an embodiment of the present invention. Referring to FIG. 1, the method may include the following process steps:

At 101: providing a substrate, such as a silicon substrate or other semiconductor substrate.

At 103: forming an amorphous layer in the substrate. The amorphous layer advantageously prevents dopants (alternatively also referred to as impurities hereinafter) of a channel stop ion implantation from diffusing into a channel.

At 105: performing a first etching process on the substrate using the amorphous layer as an etch stop layer to form one or more first fins.

At 107: performing a channel stop ion implantation into the amorphous layer to form an impurity region in the amorphous layer. For example the implanted dopants or impurities can be boron or boron difluoride ions. The impurity region can be used as a channel stop layer.

At 109: performing an annealing process to activate the impurities (implanted dopants) in the impurity region. The amorphous layer disappears during the annealing process. The annealing process can activate the impurities in the impurity region, and the impurities are not diffused outside the amorphous layer, thereby preventing the impurities of the channel stop ion implantation from diffusing into the channel. The annealing process also can repair the amorphous layer. The activation and diffusion of the implanted impurities and the repair of the amorphous layer can be performed simultaneously, thus, the amorphous layer can suppress the diffusion of the impurities into the channel.

At 111: performing a second etching process on a portion of the substrate disposed between adjacent first fins to form a plurality of second fins from the first fins.

At 113: forming an isolation region between adjacent second fins partially filling at least an air gap between the adjacent second fins. For example, the air gap between the second fins can be filled with an insulating material using a flowable chemical vapor deposition (FCVD) process to form a shallow trench isolation (STI) region.

In the embodiment, since the channel stop ion implantation and the annealing process are first performed, and the isolation region is formed thereafter, during the annealing process the impurities (implanted dopants) in the impurity region are activated, however, due to the presence of the amorphous layer, the impurities are not diffused outside the amorphous layer. Thus, comparing with conventional techniques, the impurities of the channel stop ion implantation do not diffuse into the channel while forming the isolation region, thereby preventing punch through from occurring.

It is noted that, as used herein, unless specifically stated otherwise, the terms "substantially coplanar" and "substantially flush" refer to surfaces that are sufficiently coplanar or flush within the process variation tolerance.

FIGS. 2 through 8 are cross-sectional views illustrating intermediate stages of a method for manufacturing a semiconductor device according to an embodiment of the present invention.

Figure 2:
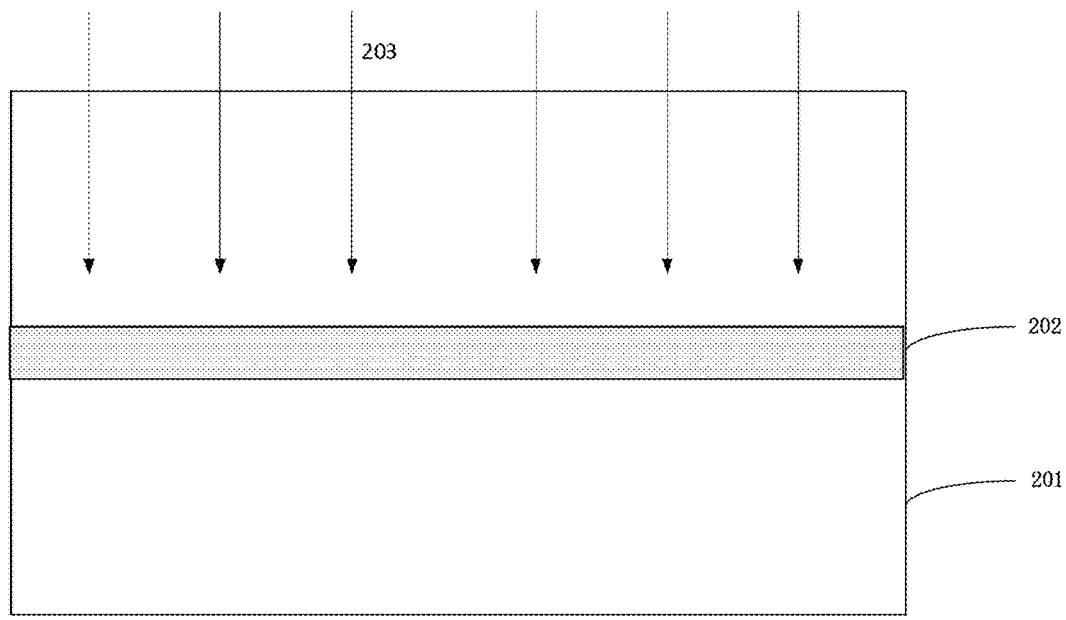
FIG. 2 is a cross-sectional view illustrating an intermediate stage of a manufacturing method according to the present invention.

Referring to FIG. 2, a substrate 201 is provided. An amorphous layer is formed in the substrate. Substrate 201 may be a mono-crystalline silicon substrate, a germanium substrate, a substrate including a III-V group material, and the like. In a preferred embodiment, an ion implantation 203 of germanium ions or carbon ions is performed into the substrate to form an amorphous layer 202. The presence of amorphous layer 202 advantageously prevents the diffusion of implanted impurities of the channel stop implant into the channel. Furthermore, a well region, e.g., a P-well (not shown) may be formed in substrate 201.

Figure 3:
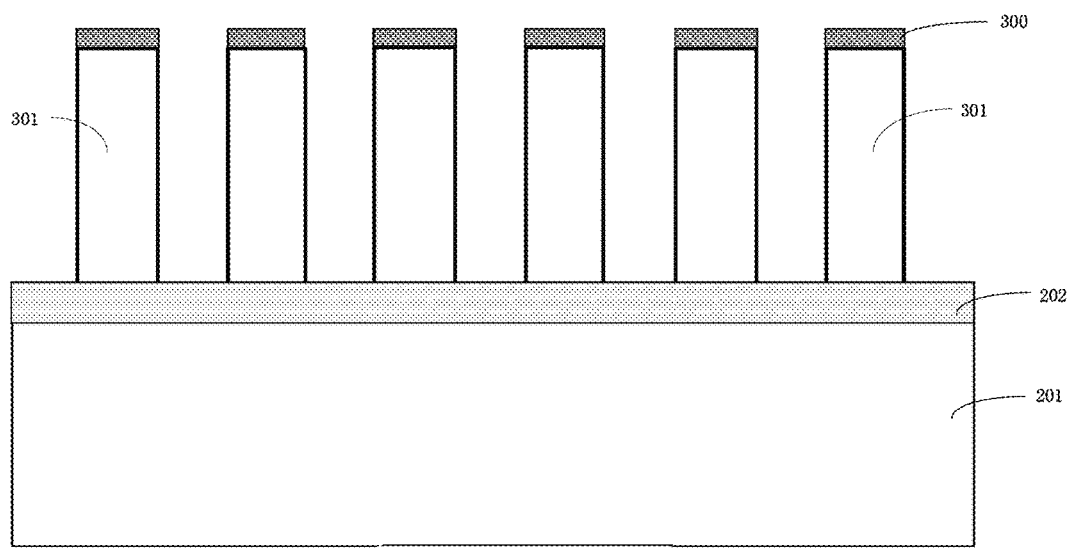
FIG. 3 is a cross-sectional view illustrating an intermediate stage of a manufacturing method according to the present invention.

Thereafter, referring to FIG. 3, a patterned hardmask 300 is formed on substrate 201. The material of hardmask 300 may be silicon nitride, silicon oxide, silicon oxynitride and the like. A first etching process, e.g., a dry etching, is performing on the amorphous layer using the hardmask as a mask to form a plurality of first fins 301.

Figure 4:
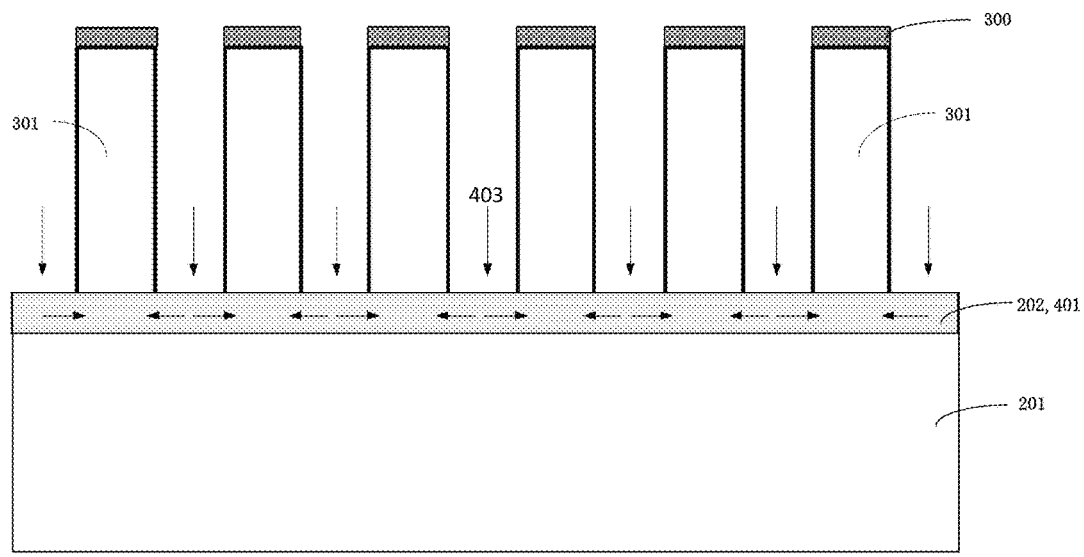
FIG. 4 is a cross-sectional view illustrating an intermediate stage of a manufacturing method according to the present invention.

Next, referring to FIG. 4, a channel stop ion implantation 403 is performed into amorphous layer 202 to form an impurity region 401. It is noted herein that impurity region 401 is integral with amorphous layer 202. Impurities of impurity region 401 are laterally diffused in amorphous layer 202. For example, for an NMOS device, boron ions or boron difluoride ions can be implanted into the amorphous layer to form an impurity region, which can serve as a channel stop layer. In some embodiments, the impurity region and the well region can have the same conductivity type, and the doping concentration of the well region is less than the doping concentration of the impurity region. For an NMOS device, a P-well may be formed in the substrate, the P-well and the impurity region may have P-type conductivity, and the doping concentration of the P-well region is less than the doping concentration of the impurity region.

Figure 5:
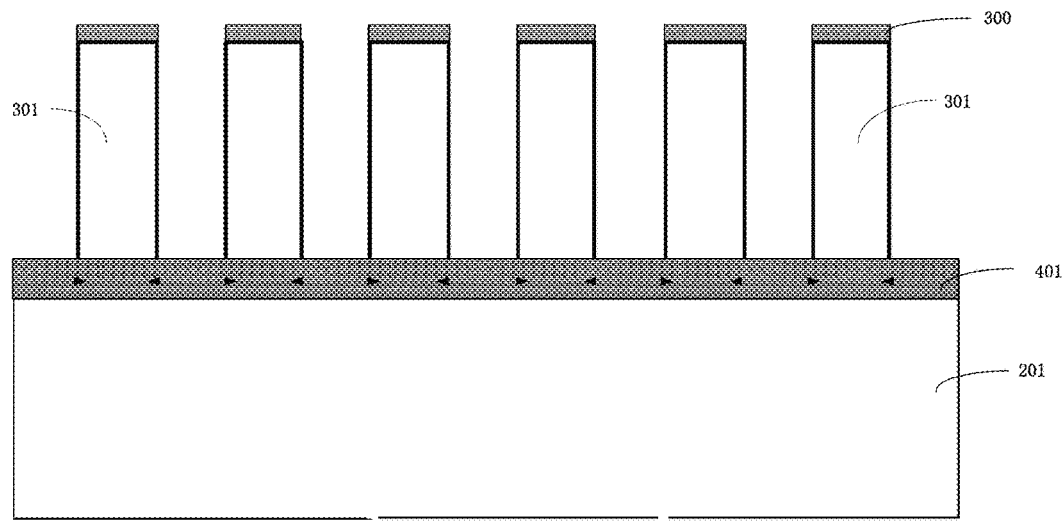
FIG. 5 is a cross-sectional view illustrating an intermediate stage of a manufacturing method according to the present invention.

Next, referring to FIG. 5, an annealing process is performed to activate impurities in impurity region 401. Amorphous layer 202 disappears during the annealing process.

Figure 6:
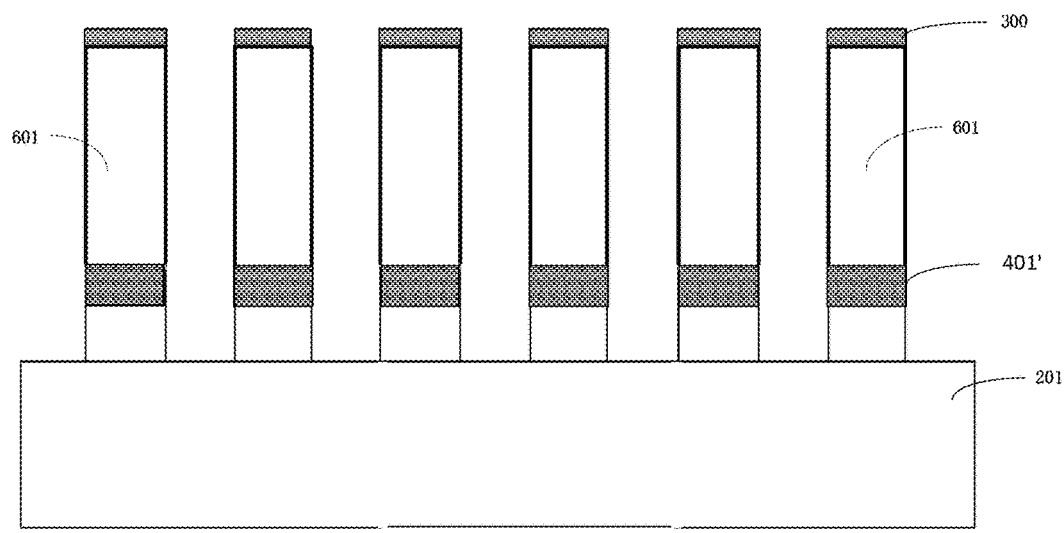
FIG. 6 is a cross-sectional view illustrating an intermediate stage of a manufacturing method according to the present invention.

Next, referring to FIG. 6, a second etching process is performing on a portion of the substrate disposed between adjacent first fins to remove the portion of the substrate and to form second fins. A first portion of impurity region 401 is also removed by the second etching process, so that the second fins include a second portion 401' of impurity region 401.

Figure 7:
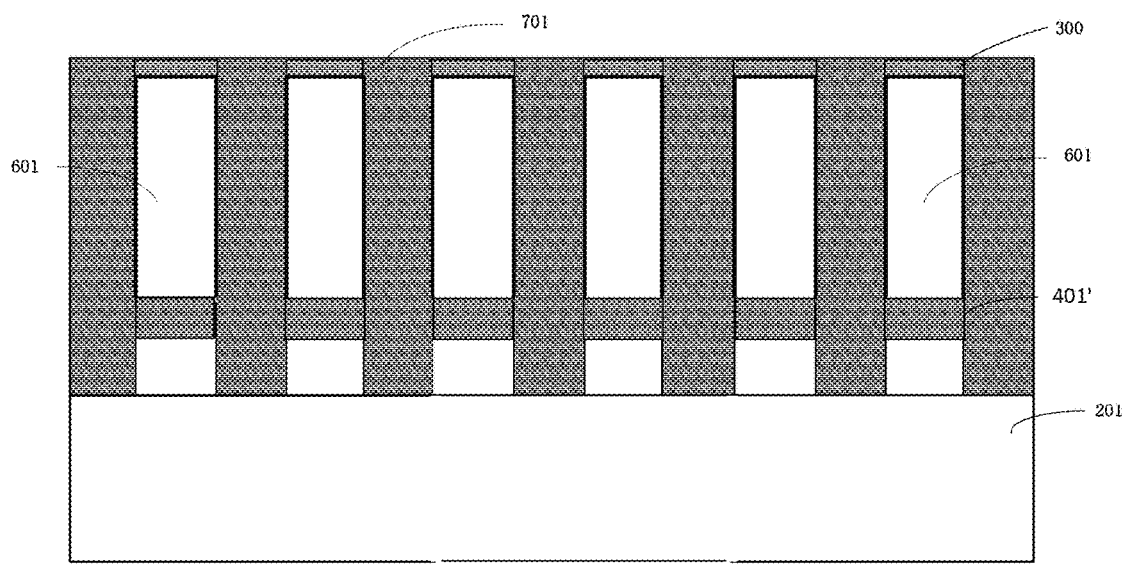
FIG. 7 is a cross-sectional view illustrating an intermediate stage of a manufacturing method according to the present invention.

Next, referring to FIG. 7, an air gap region between the second fins is filled with an insulating material 701 using a flowable chemical vapor deposition (FCVD) process. Thereafter, a high-temperature annealing process is performed. Because impurities of impurity region 401 have been activated, therefore, the formation of the isolation region will not cause the impurity diffusion. Thereafter, a planarization, e.g., a chemical mechanical polishing (CMP) process, is performed on insulation material 701 so that the top surface of insulation material 701 is substantially flush with the top surface of hardmask 300, as shown in FIG. 7.

Figure 8:
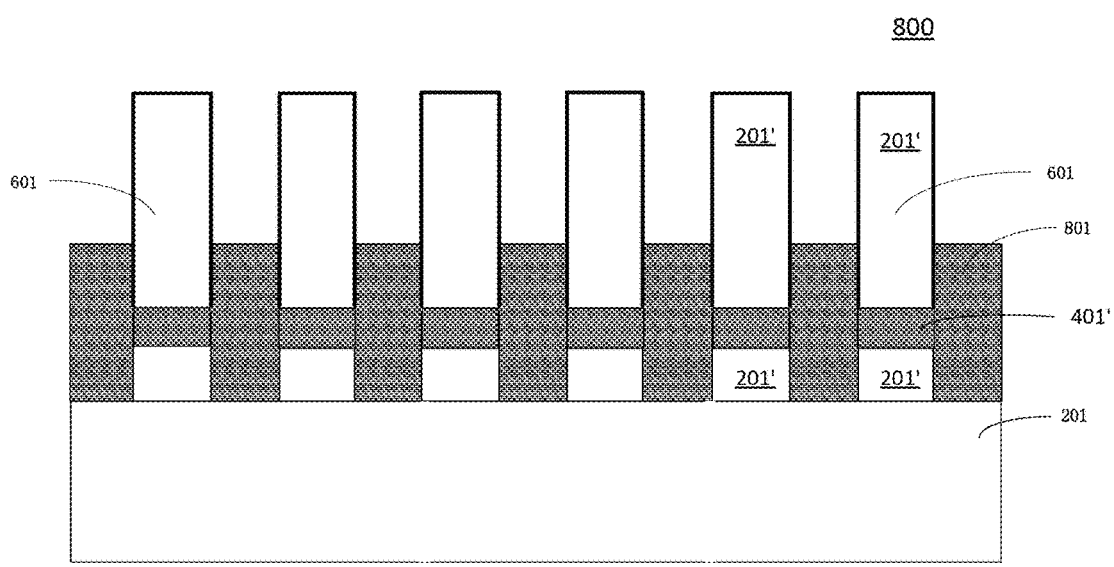
FIG. 8 is a cross-sectional view illustrating an intermediate stage of a manufacturing method according to the present invention.

Next, referring to FIG. 8, insulating material 701 is etched back to expose at least a portion of second fins 601. Hardmask 300 is then removed, thereby forming a second isolation region 801 between adjacent second fins 601.

A semiconductor device 800 is thus formed as shown in FIG. 8. Referring to FIG. 8, semiconductor device 800 includes a substrate 201, a plurality of fins 601, and an isolation region 801 disposed between adjacent fins 601.

Each of the fins 601 includes a semiconductor material region 201' and an impurity region 401' within the semiconductor material region. Impurity region 401 may be used to form a channel stop layer. In a preferred embodiment, the upper surface of impurity region 401 is below the upper surface of isolation region 801. In one embodiment, a well region (not shown) is formed in substrate 201. The well region and impurity region 401' have the same conductivity type, and the doping concentration of the well region is less than the doping concentration of impurity region 401.

The foregoing descriptions of specific embodiments of the present invention have been presented for purpose of illustration and description. They are not intended to be exhaustive or to limit the invention to the precise forms disclosed, and obviously many modifications and variations are possible in light of the above disclosure. The exemplary embodiment has been described in order to best explain the principles of the invention and its practical application. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing a semiconductor device comprising:
   providing a substrate;
   forming an amorphous layer in the substrate;
   performing a first etching process on the substrate using the amorphous layer as an etch stop layer to form a plurality of first fins;
   performing a channel stop ion implantation process into the amorphous layer to form an impurity region;
   performing an annealing process to activate dopants in the impurity region, wherein the amorphous layer disappears during the annealing process;
   after the annealing process, performing a second etching process on a region of the substrate disposed between the first fins to form a plurality of second fins from the first fins; and
   forming an isolation region between adjacent second fins by filling an air gap between the second fins with an insulating material, the isolation region having an upper surface higher than an upper surface of the impurity region.

2. The method of claim 1, wherein forming the amorphous layer comprises:
   implanting germanium ions or carbon ions in the substrate.

3. The method of claim 1, wherein performing the first etching process comprises:
   forming a patterned hardmask on the substrate; and
   performing the first etching process on the substrate using the patterned hardmask as a mask to form the first fins.

4. The method of claim 3, wherein forming the isolation region comprises
   depositing the insulating material in the air gap between the second fins and covering the second fins and the hardmask;

planarizing the insulating material until an upper surface of the insulating material is flush with an upper surface of the hardmask;

performing an etching back process on the planarized insulating material to expose at least a portion of the second fins;

removing the hardmask.

5. The method of claim 4, wherein depositing the insulating material comprises:

performing a flowable chemical vapor deposition process.

6. The method of claim 1, wherein forming the amorphous layer comprises:

performing an ion implantation process with boron ions or boron difluoride ions on the substrate.

7. The method of claim 1, further comprising:

forming a well region in the substrate, wherein the well region and the impurity region have a same conductivity type, and a doping concentration of the well region is less than a doping concentration of the impurity region.

8. The method of claim 1, wherein performing a second etching process comprises performing the second etching process on a region of the impurity region and the substrate disposed between the first fins to form a plurality of second fins under the impurity region and the first fins.

* * * * *